United States Patent
Liao et al.

(10) Patent No.: US 10,665,536 B2
(45) Date of Patent: May 26, 2020

(54) 3D IC DECOUPLING CAPACITOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Wen-Shiang Liao, Miaoli County (TW); Chewn-Pu Jou, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/567,840

(22) Filed: Sep. 11, 2019

(65) Prior Publication Data

US 2020/0006218 A1    Jan. 2, 2020

Related U.S. Application Data

(62) Division of application No. 15/600,224, filed on May 19, 2017, now Pat. No. 10,468,345.

(51) Int. Cl.
| | |
|---|---|
| *H01L 23/522* | (2006.01) |
| *H01L 23/31* | (2006.01) |
| *H01L 23/00* | (2006.01) |
| *H01L 21/56* | (2006.01) |

(52) U.S. Cl.
CPC ........ *H01L 23/5223* (2013.01); *H01L 21/565* (2013.01); *H01L 23/3128* (2013.01); *H01L 23/5226* (2013.01); *H01L 24/13* (2013.01); *H01L 24/19* (2013.01); *H01L 2224/18* (2013.01); *H01L 2224/73267* (2013.01)

(58) Field of Classification Search
CPC . H01L 29/6618; H01L 28/91; H01L 23/5223; H01L 24/13; H01L 21/565; H01L 23/3128; H01L 23/5226
See application file for complete search history.

(56) References Cited

U.S. PATENT DOCUMENTS

| | | | |
|---|---|---|---|
| 2010/0230806 A1* | 9/2010 | Huang | H01L 23/50 257/723 |
| 2014/0057408 A1* | 2/2014 | Lindert | H01L 27/10852 438/387 |

* cited by examiner

*Primary Examiner* — Latanya N Crawford

(74) *Attorney, Agent, or Firm* — WPAT, P.C., Intellectual Property Attorneys; Anthony King

(57) ABSTRACT

A semiconductor structure is disclosed. The semiconductor structure includes: a polymer base layer; a backside redistribution layer (RDL) over the polymer base layer; a molding layer over the backside RDL; a polymer layer over the molding layer; a front side RDL over the polymer layer; and a metal-insulator-metal (MIM) capacitor vertically passing through the molding layer, the MIM capacitor including a first electrode, an insulation layer and a second electrode, wherein the insulation layer surrounds the first electrode, and the second electrode surrounds the insulation layer, and the molding layer surrounds the second electrode. An associated method for manufacturing a semiconductor structure is also disclosed.

20 Claims, 20 Drawing Sheets

3D IC DECOUPLING CAPACITOR STRUCTURE AND METHOD FOR MANUFACTURING THE SAME

CROSS REFERENCE TO RELATED APPLICATIONS

This application is a division of application Ser. No. 15/600,224, filed on May 19, 2017. All of the above-referenced applications are hereby incorporated herein by reference in their entirety.

BACKGROUND

Capacitors are widely used in integrated circuits. The capacitance of a capacitor is proportional to the capacitor area and the dielectric constant (k) of the insulation layer, and is inversely proportional to the thickness of the insulation layer. Therefore, to increase the capacitance, it is preferable to increase the area and k value and to reduce the thickness of the insulation layer.

A problem associated with the increased area is that a greater chip area is required. Conventional metal-insulator-metal (MIM) capacitors in integrated circuits have various horizontal comb structures. The horizontal structure capacitance correlates with inter-metal layer thickness. However, the thickness of an inter-metal layer is very difficult to control. This results in high variation of MIM capacitance in production for a target value. Accordingly, new methods and structures are desired for MIM capacitors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
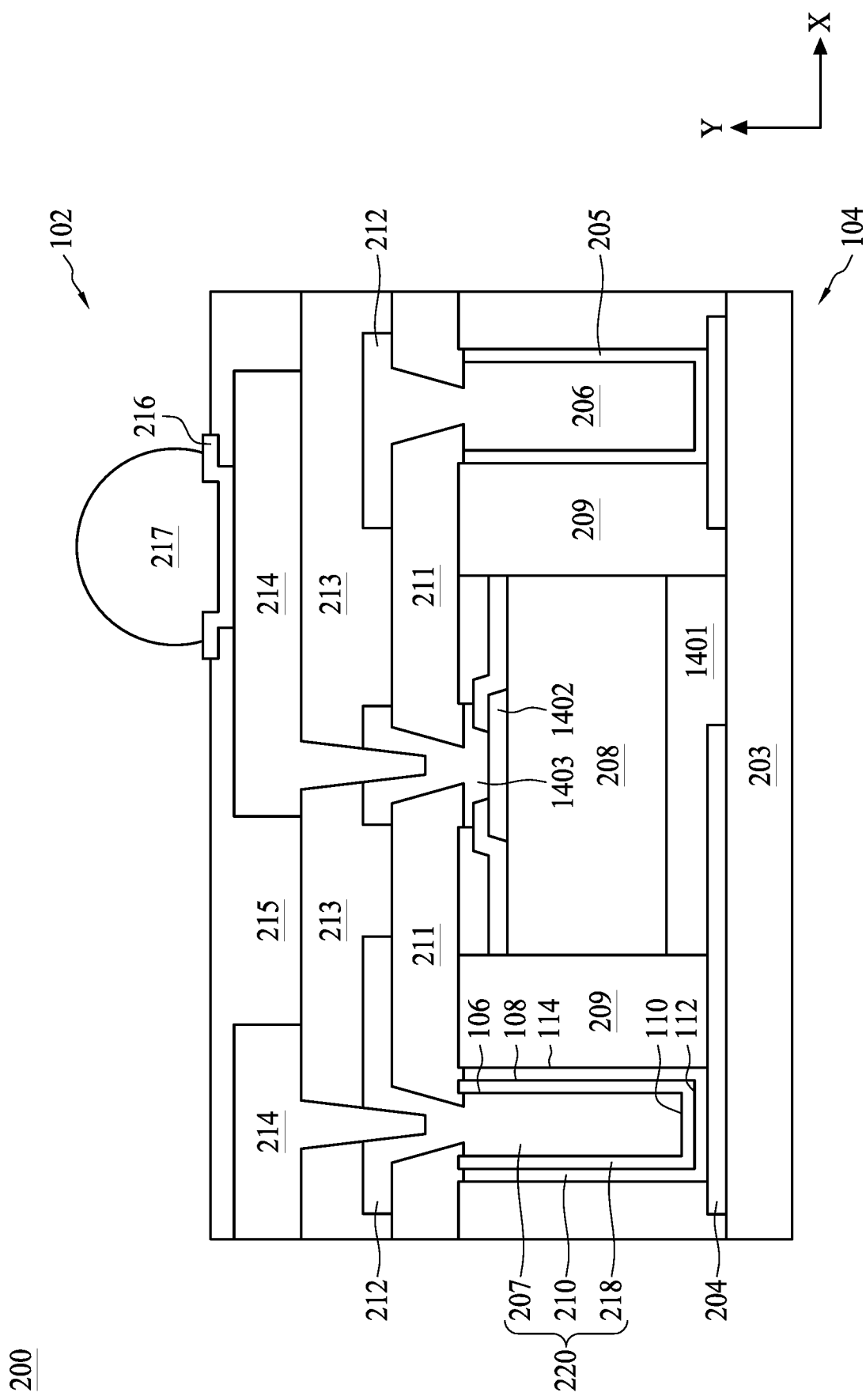
FIG. 1 is a schematic diagram illustrating an integrated Fan-Out (InFO) package including a metal-insulator-metal (MIM) capacitor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic diagram illustrating an integrated Fan-Out (InFO) package 200 including a metal-insulator-metal (MIM) capacitor 220 in accordance with some embodiments of the present disclosure. An upper side of the InFO package 200 shown in FIG. 1 is referred to as a front side 102, and a lower side of the InFO package 200 is referred to as a backside 104. For illustration, the InFO package 200 includes a polymer base layer 203, an InFO backside redistribution layer (RDL) 204, a conductive layer 205, a conductive through molding via (TMV) 206, a device die 208, a molding layer 209, polymer layers 211, 213, and 215, InFO front side redistribution layers (RDLs) 212 and 214, an under bump metallurgies (UBM) 216, an external connector 217, and the MIM 220. Please note that the TMV 206 may be also referred to as through insulator vias (TIV).

As illustratively shown in FIG. 1, in some embodiments, the MIM capacitor 220 includes the first electrode 207, the insulation layer 218 and the second electrode 210. The molding layer 209 surrounds or circles around an outer sidewall sidewall 114 of the second electrode 210; the second electrode 210 surrounds or circles around an outer sidewall 108 of the insulation layer 218; and the insulation layer 218 surrounds or circles around an outer sidewall sidewall 106 of the first electrode 207. In addition, an outer bottom surface 112 of the insulation layer 218 is covered by the second electrode 210; and an outer bottom surface 110 of the first electrode 207 is covered by the insulation layer 218. In other words, the outer sidewall 106 and the outer bottom surface 110 of the first electrode 207 is lined with the insulation layer 218; and the outer sidewall 108 and the outer bottom surface 112 of the insulation layer 218 is lined with the second electrode 210. Since the MIM capacitor 220 is fabricated simultaneously with other features of the package 200, the manufacturing cost is relatively low.

For illustration, the MIM capacitor 220 is formed within the molding layer 209. The first electrode 207 of the MIM capacitor 220 is electrically coupled to the RDL 214, the second electrode 210 of the MIM capacitor 220 is electrically coupled to the InFO backside RDL 204. The first electrode 207 and the second electrode 210 of the MIM capacitor 220 are formed by a conductive material overlying a seed layer. The first electrode 207 and the second electrode 210 of the MIM capacitor 220 are insulated by the insulation layer 218. The MIM capacitor 220 is filled within the TMV extending through the molding layer 209.

In some embodiments, a molding compound is applied in the molding layer 209 to surround the device die 208 and the MIM capacitor 220 on the polymer base layer 203. In some embodiments, the molding compound MC includes high-k polymer or silica.

In some embodiments, the polymer layer 211 overlies the molding layer 209. The RDL 212 overlies the polymer layer 211. The polymer layer 213 overlies the RDL 212. The RDL 214 overlies the polymer layer 213. The polymer layer 215 overlies the RDL 214. The Under Bump Metallurgies (UBMs) 216 are formed over the RDL 214. The external connectors 217 are disposed on the UBMs 216 and configured to be the input/output (I/O) pads, including, for example, solder balls, to electrically connect to the device die 208 through the RDL 214. In some embodiments, the external connectors 217 are ball grid array (BGA) balls, controlled collapse chip connector (C4) bumps, or the like. In some embodiments, the connectors 217 are used to electrically connect package 200 to other package components including, for example, another device die, interposers, package substrates, printed circuit boards, a mother board, or the like.

FIGS. 2-20 are cross sectional views of the InFO package 200 at different stages of the manufacturing process, in accordance with some embodiments of the present disclosure. Like elements in FIGS. 2-20 are designated with the same reference numbers for ease of understanding. After the different stages in FIGS. 2-20, the package 200 has the cross sectional view in FIG. 1. Although FIGS. 2-20 are described, it will be appreciated that the structures disclosed in FIG. 1 are not limited to the manufacturing process shown in FIGS. 2-20. While disclosed manufacturing process is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
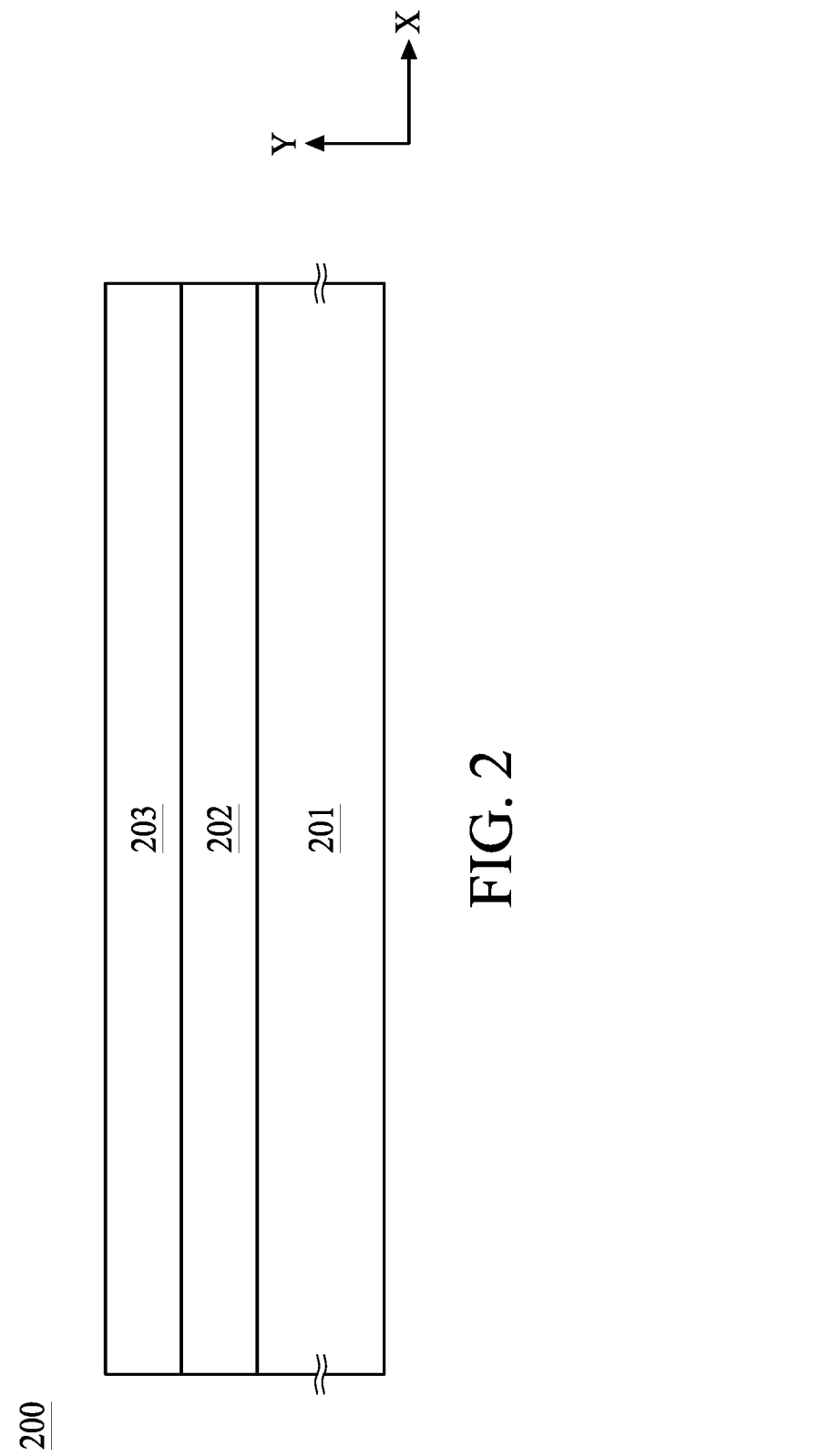
FIGS. 2-20 are cross sectional views of the InFO package at different stages of the manufacturing process, in accordance with some embodiments of the present disclosure.

As illustrated in FIG. 2, the carrier 201, the adhesive layer 202, and the polymer base layer 203 are provided. In some embodiments, the carrier 201 includes glass, ceramic, or other suitable material to provide structural support during the formation of various features in device package. In some embodiments, the adhesive layer 202, including, for example, a glue layer, a light-to-heat conversion (LTHC) coating, an ultraviolet (UV) film or the like, is disposed over the carrier 201. The polymer base layer 203 is coated on the carrier 201 via the adhesive layer 202. In some embodiments, the carrier 201 and the adhesive layer 202 are removed from the InFO package after the packaging process. In some embodiments, the polymer base layer 203 is formed of PolyBenzOxazole (PBO), Ajinomoto Buildup Film (ABF), polyimide, BenzoCycloButene (BCB), Solder Resist (SR) film, Die-Attach Film (DAF), or the like, but the present disclosure is not limited thereto.

Figure 3:
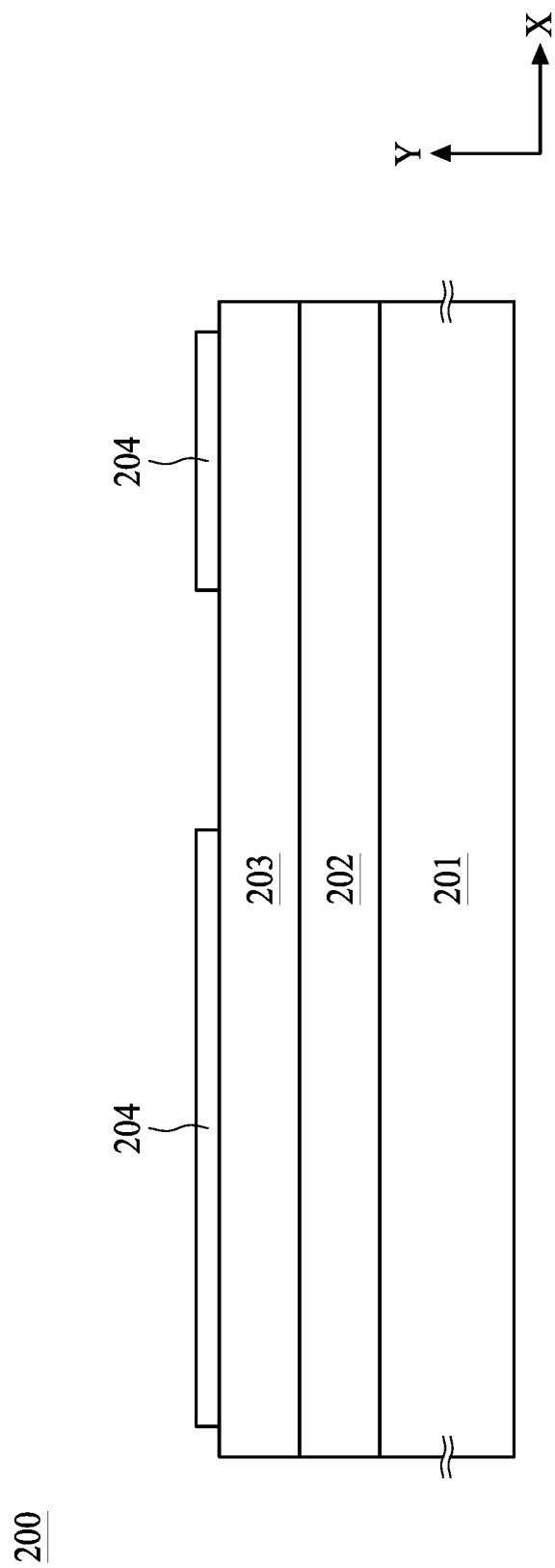

Subsequently, the RDL 204 is formed, as illustrated in FIG. 3. In some embodiments, the RDL 204 includes conductive features, including, for example, conductive lines and/or vias, formed in one or more polymer layers. In some embodiments, the polymer layers are formed of any suitable material, including PI, PBO, BCB, epoxy, silicone, acrylates, nano-filled pheno resin, siloxane, a fluorinated polymer, polynorbornene, or the like, using any suitable method, including, for example, a spin-on coating technique, sputtering, and the like.

In some embodiments, the conductive features are formed in polymer layers. The formation of such conductive features includes patterning polymer layers, for example, using a combination of photolithography and etching processes, and forming the conductive features in the patterned polymer layers, for example, depositing a seed layer (i.e., TiCu) and then plating a conductive metal layer (i.e., Cu) and using a mask layer to define the shape of the conductive features. For illustration, some conductive features are designed to form functional circuits coupled to the MIM capacitor 220, and input/output features for subsequently attached dies.

Figure 4:
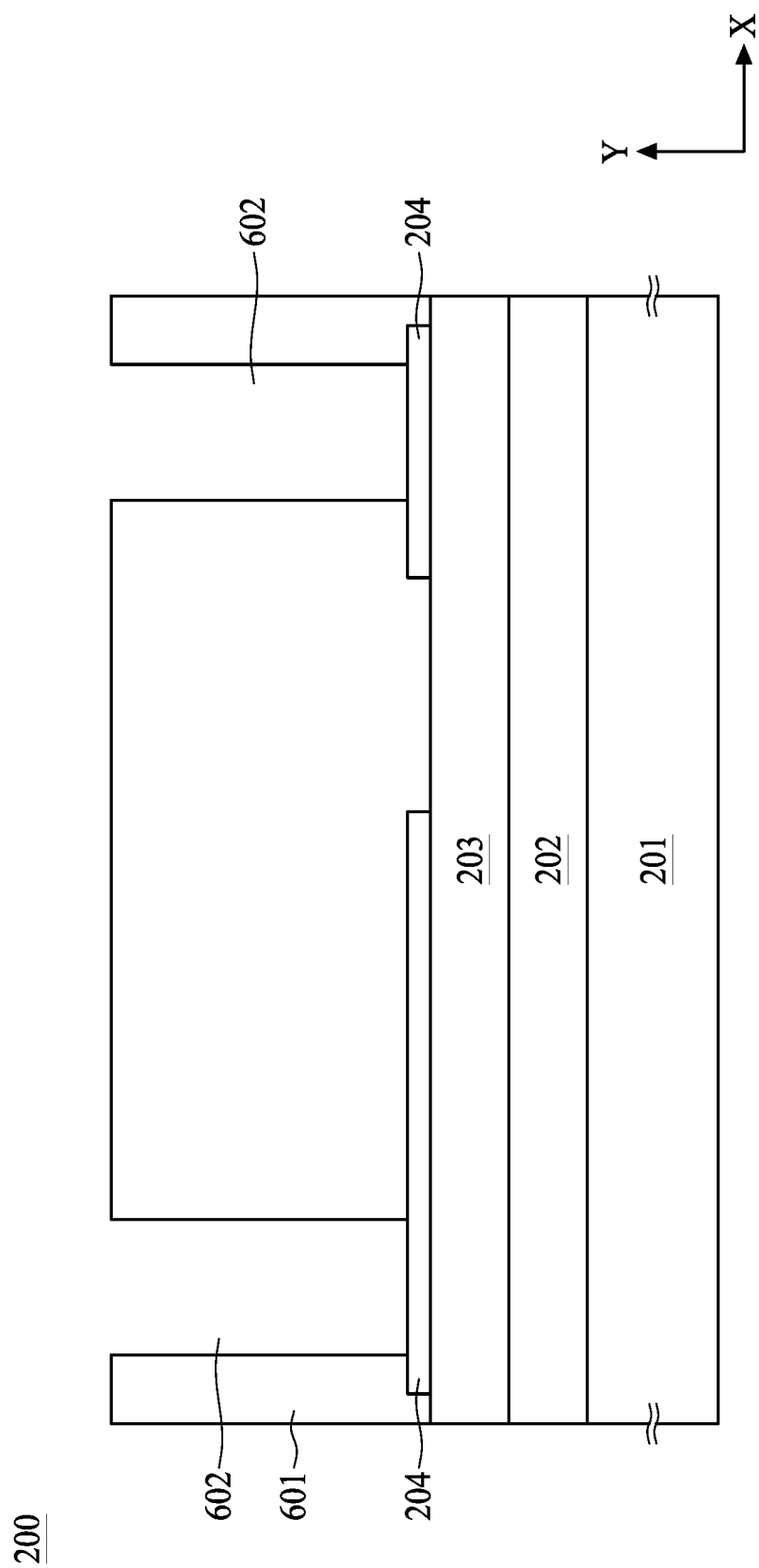

Next, a patterned photoresist 601 is formed over the RDL 204 and the carrier 201, as illustrated in FIG. 4. In some embodiments, for example, a photoresist is deposited as a blanket layer over the RDL 204. Next, portions of the photoresist are exposed using a photo mask (not shown). Exposed or unexposed portions of the photoresist are then removed depending on whether a negative or positive resist is used. The resulting patterned photoresist 601 includes openings 602 vertically, i.e. along Y-axis, passing through the patterned photoresist 601. In some embodiments, the openings 602 further expose conductive features in the RDL 204. The openings 602 may have a high aspect ratio with a height of about 180 um to about 250 um and a width of about 50 um to about 300 um.

Figure 5:
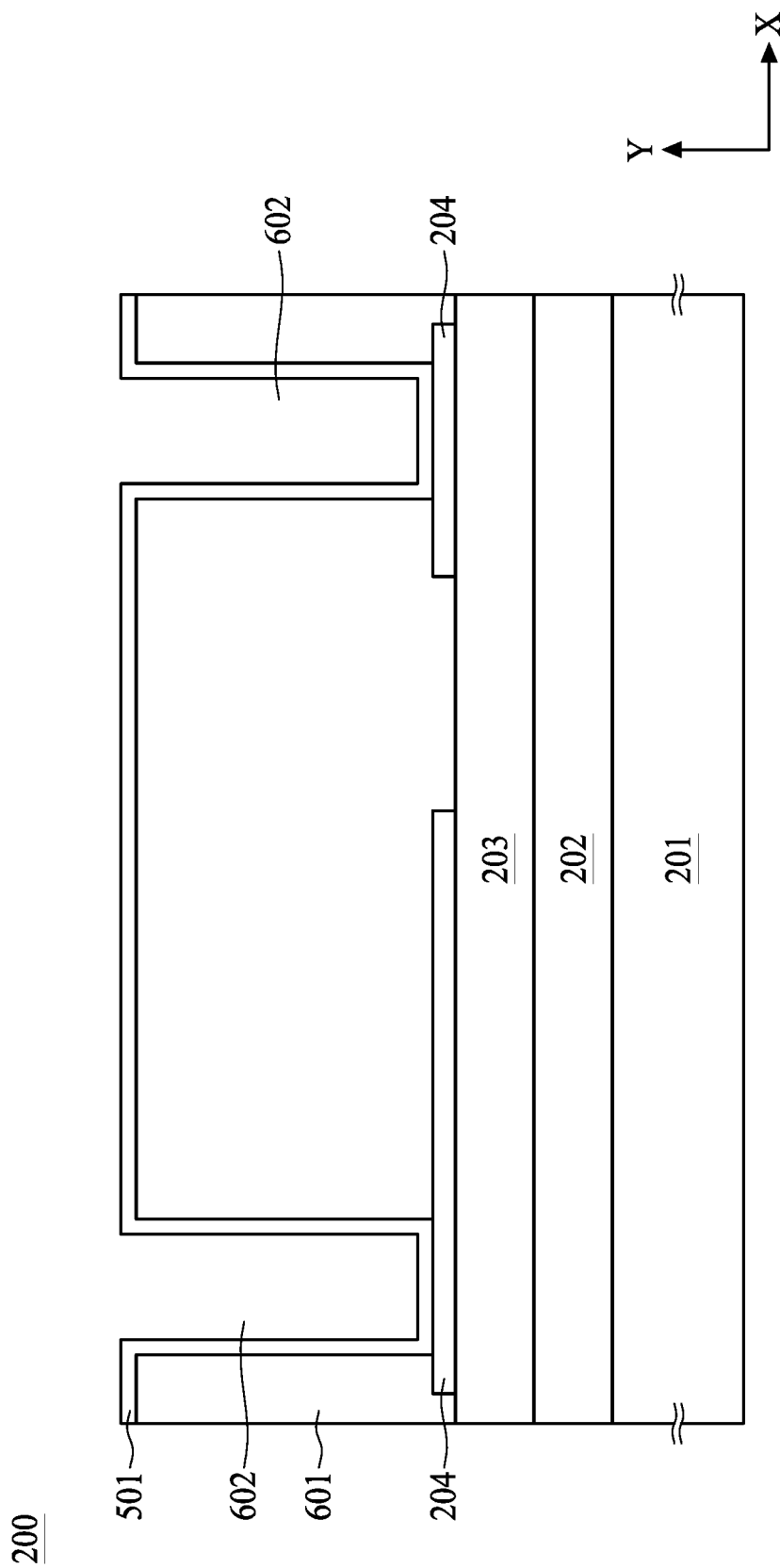

Next, a conductive layer 501 is deposited overlying the patterned photoresist 601, as illustrated in FIG. 5. The conductive layer 501 may be formed of any suitable conductive material, including Cu, Ni, Pt, Al, lead-free solder (e.g., SnAg, SnCu, SnAgCu), combinations thereof, or the like, and may be formed through any number of suitable techniques, including electroplating, physical vapor deposition (PVD), chemical vapor deposition (CVD), electrochemical deposition (ECD), molecular beam epitaxy (MBE), atomic layer deposition (ALD), and the like. The conductive layer 501 may have a thickness of about 1 um to about 8 um. In some embodiments, a seed layer may be deposited overlying the patterned photoresist 601 before the conductive layer 501 is deposited. The seed layer may be a thin layer of a conductive material that aids in the formation of the thicker conductive layer 501. In an embodiment, the seed layer is formed by depositing a thin layers of Ti, Cu, Ta, TiN, TaN, combinations thereof, or the like, using CVD or PVD techniques.

Figure 6:
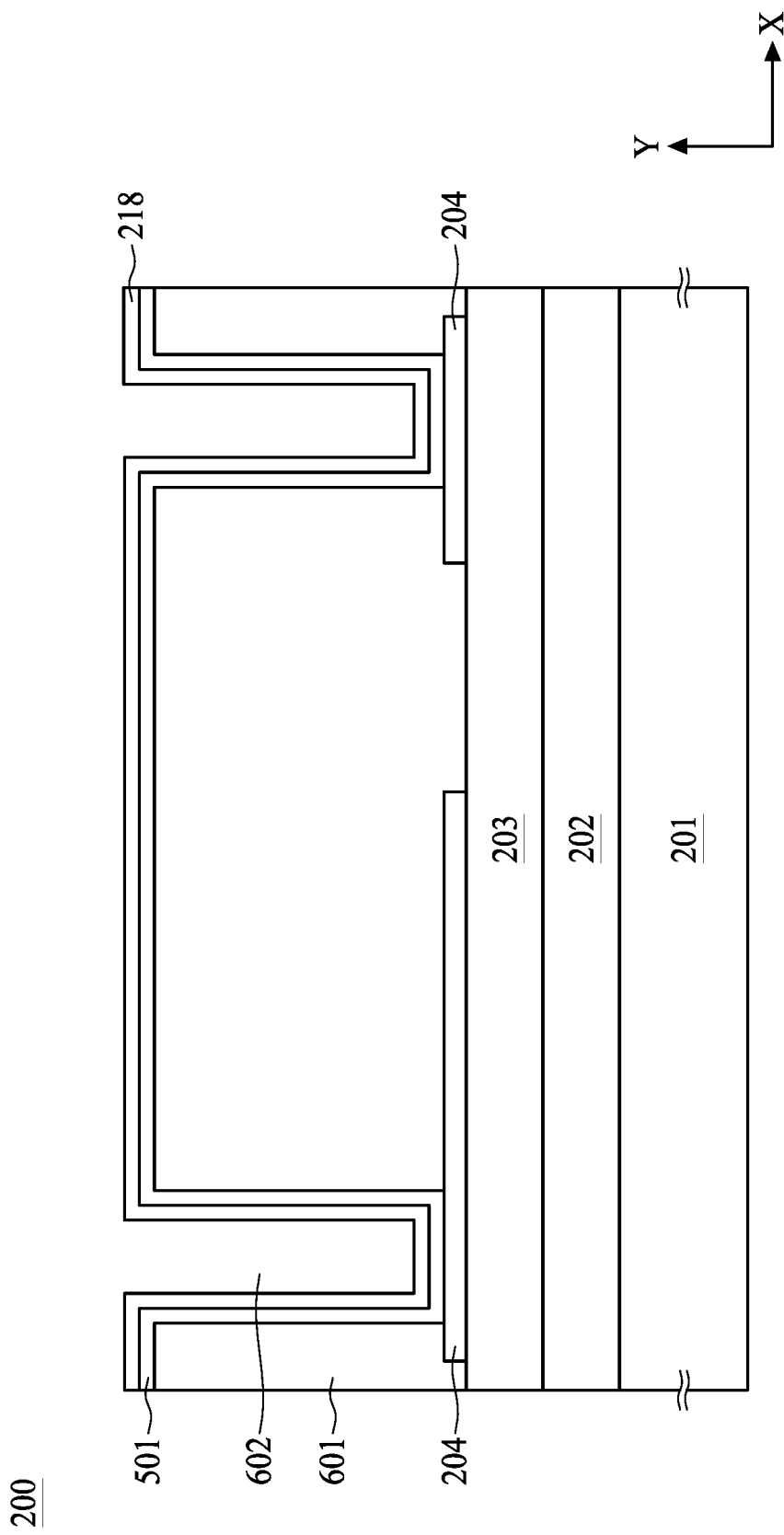

Next, the insulation layer 218 is deposited overlying the conductive layer 501 as illustrated in FIG. 6. The insulation layer 218 may be formed of any suitable dielectric material. In some other embodiments, the insulation layer 218 may include low-temperature (e.g., 180° C.) silicon dioxide (CVD—$SiO_2$), silicon nitride ($SiN_x$, having dielectric constant (k) of about 6.9) or silicon oxynitride ($SiO_xN_y$) deposited by any suitable depositions such as chemical vapor deposition (CVD), plasma enhanced CVD (PECVD), sub-atmospheric CVD (SACVD), atmospheric pressure CVD (APCVD), metal organic CVD (MOCVD), laser CVD (LCVD), etc. In some embodiments, the insulation layer 218 may include low-temperature (e.g., <240° C.) titanium dioxide ($TiO_2$) deposited by LCVD, electron beam (e.g. electronic gun) evaporation or etc. In some embodiments, the insulation layer 218 may include low-temperature (e.g., 210° C.) high-k dielectric material such as zirconium dioxide ($ZrO_2$), aluminum oxide ($Al_2O_3$), hafnium oxide ($HfO_x$), Hafnium silicate ($HfSiO_x$), zirconium titanate ($ZrTiO_x$), tantalum oxide ($TaO_x$), a laminated layer of $ZrO_2$—$Al_2O_3$—$ZrO_2$ (ZAZ, having dielectric constant (k) of about 13.6), etc. In some embodiments, the insulation layer 218 may include strontium titanate ($SrTiO_3$ having dielectric constant (k) of about 83 to about 100) or barium titanate ($BaTiO_3$, having dielectric constant (k) of about 500). In some embodiments, the insulation layer 218 may include barium strontium titanate ($BaSrTiO_3$, BST), lead zirconate titanate ($PbZrTiO_3$, PZT).

Figure 7:
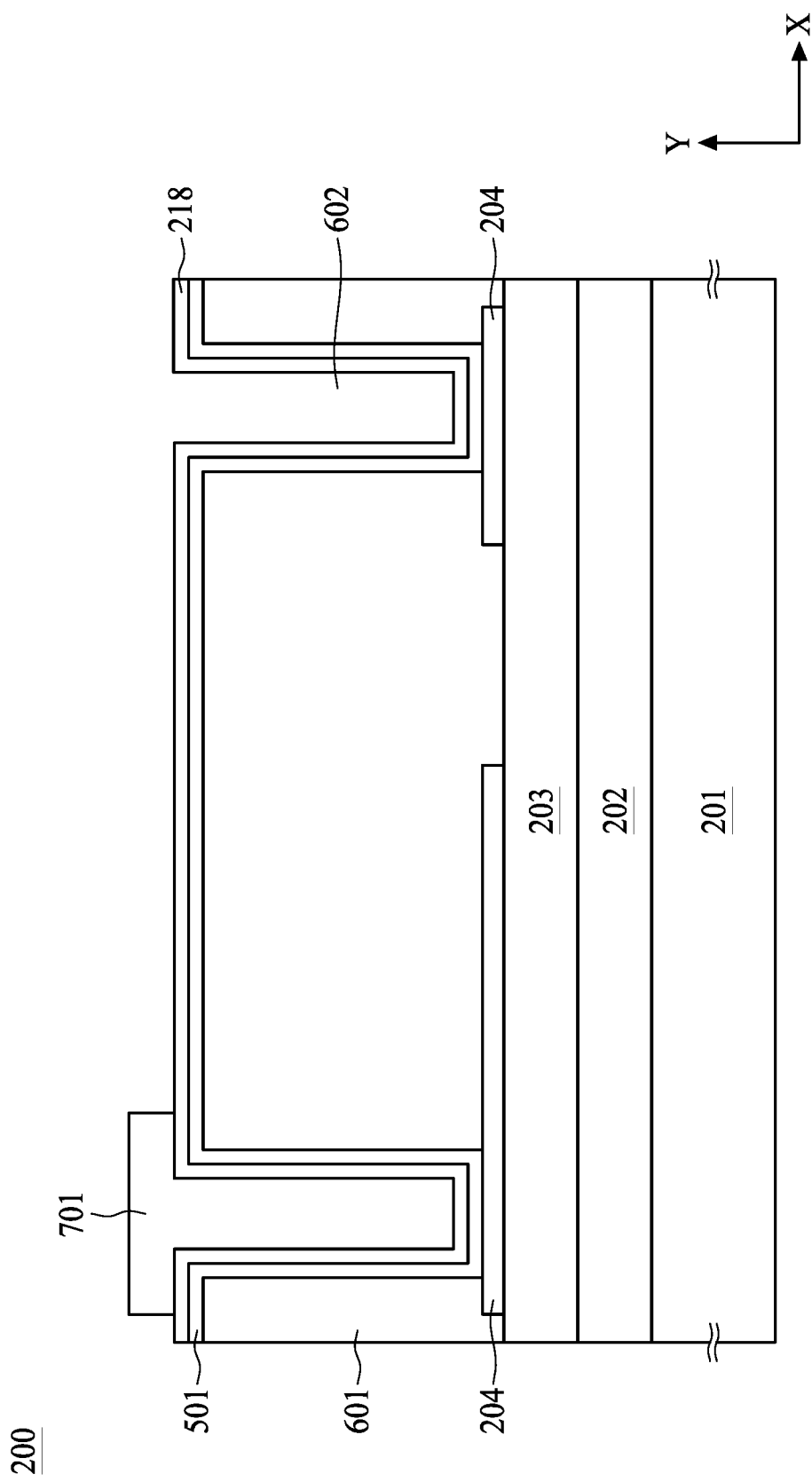

Next, a patterned photoresist 701 is formed over the insulation layer 218, as illustrated in FIG. 7. In some embodiments, for example, a photoresist is deposited as a blanket layer over the insulation layer 218. Next, portions of the photoresist are exposed using a photo mask (not shown). Exposed or unexposed portions of the photoresist are then removed depending on whether a negative or positive resist is used. The resulting patterned photoresist 701 fills the opening 602 at the left side for the MIM capacitor 220. In addition, the resulting patterned photoresist 701 as well covers a portion of a top surface of the insulation layer 218 around a top end of the opening 602 filled by the photoresist. The opening 602 at the right side is left uncovered by the photoresist. Please note that when fabricating the MIM capacitor 220 simultaneously with other features of the package 200, the patterned photoresist 701 may be the only mask additionally required.

Figure 8:
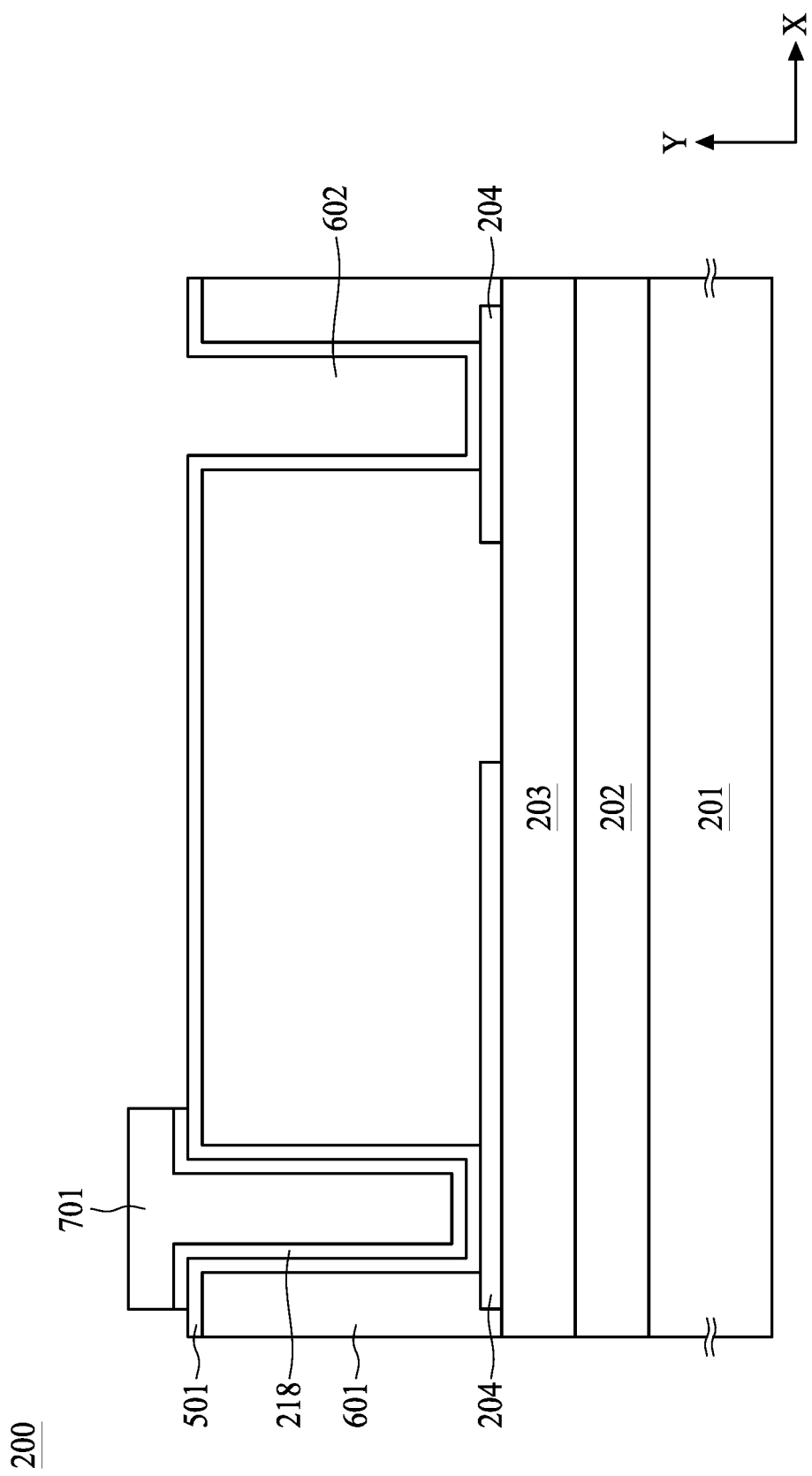
Figure 9:
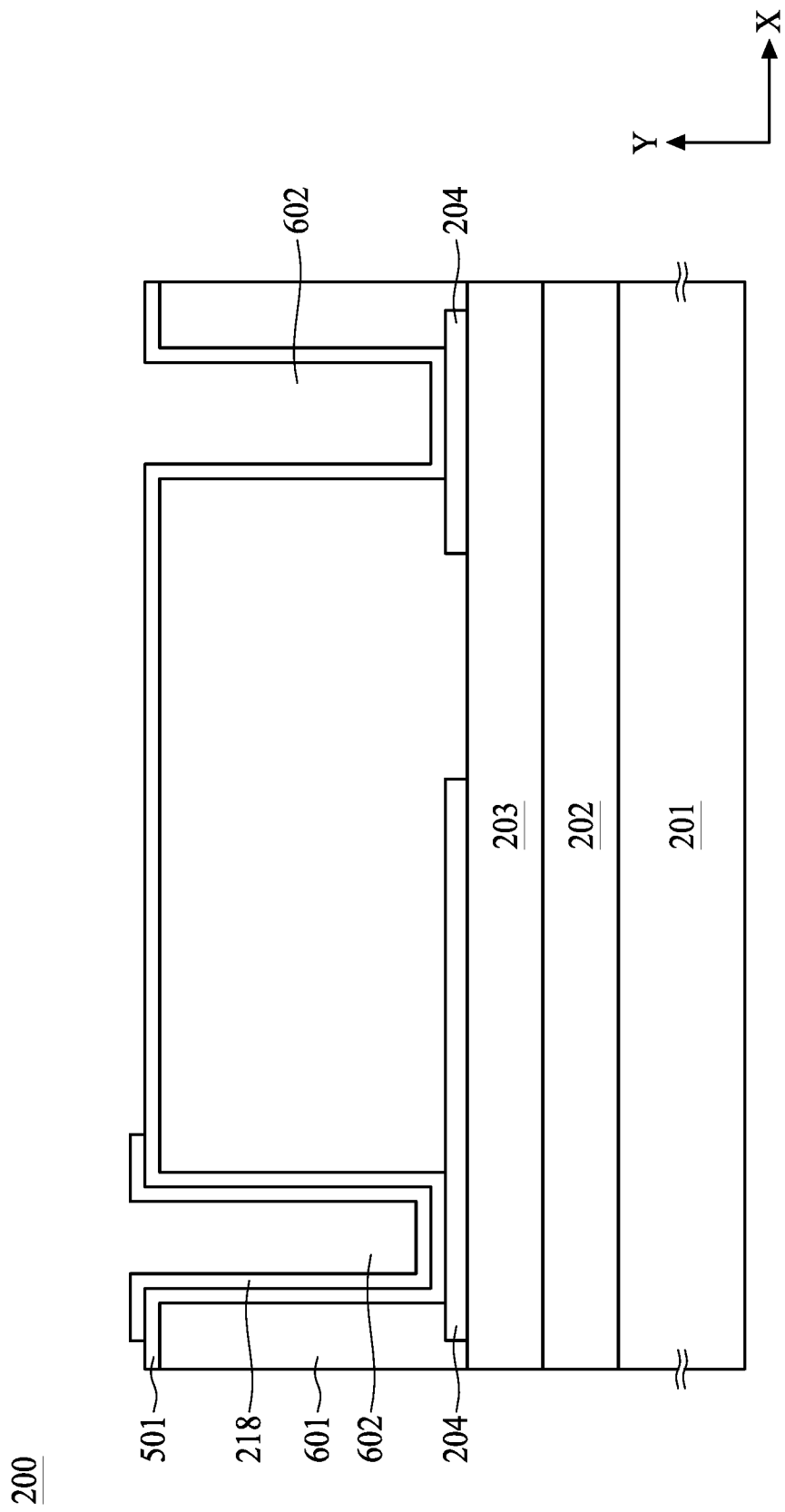
Figure 10:
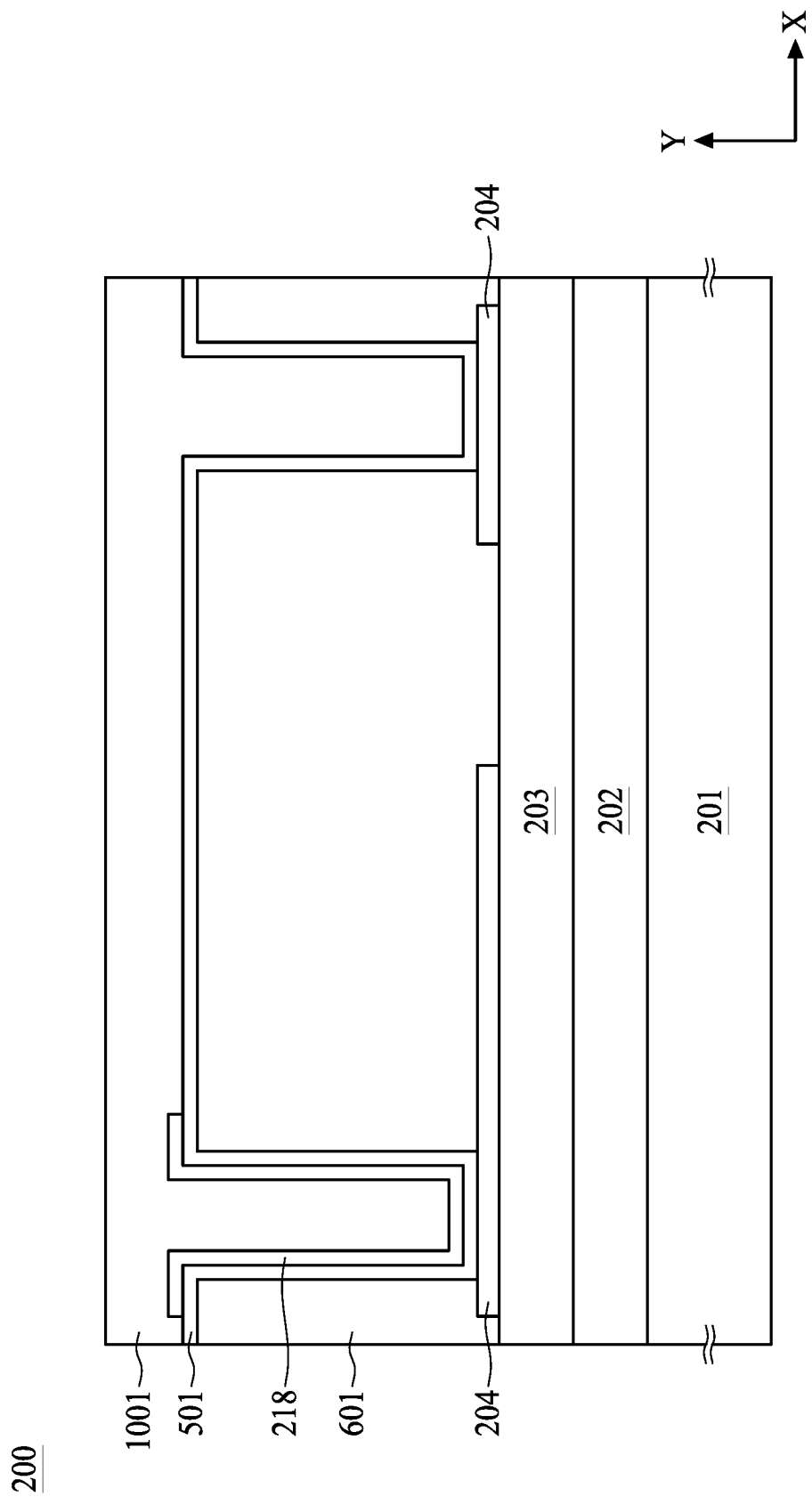

In FIG. 8, exposed portions of the insulation layer 218 may be removed to expose the underlying conductive layer 501. In some embodiments, a dry etch process is carried out by a plasma etch process that effectively removes the high-k dielectric layer. Preferably, the plasma is generated from one or more halogen containing gases including $CF_4$, $CHF_3$, $CH_2F_2$, $CH_3F$, $BCl_3$, $Br_2$, HF, HCl, HBr, Hl, and $NF_3$. The process may further employ one or more inert gases including Ar, He, Xe, and nitrogen. Optionally, one or more oxidant gases such as $O_2$, CO, $CO_2$, and $N_2O$ may be added to the halogen containing gases or to the mixture of halogen containing gases and inert gases. After the exposed portions of the insulation layer 218 are etched back, the patterned photoresist 701 is removed as shown in FIG. 9.

Next, a conductive layer 1001 is deposited overlying the conductive layer 501, the insulation layer 218 and fills the openings 602. The conductive layer 1001 may be formed of any suitable conductive material, including Cu, Ni, Pt, Al, lead-free solder (e.g., SnAg, SnCu, SnAgCu), combinations thereof, or the like, and may be formed through any number of suitable techniques, including electroplating, physical vapor deposition (PVD), chemical vapor deposition (CVD), electrochemical deposition (ECD), molecular beam epitaxy (MBE), atomic layer deposition (ALD), and the like. The conductive layer 1001 may have a thickness of about 2 um to about 10 um. In some embodiments, a seed layer may be deposited overlying the conductive layer 501 and the insulation layer 218 before the conductive layer 1001 is deposited. The seed layer may be a thin layer of a conductive material that aids in the formation of the thicker conductive layer 1001. In an embodiment, the seed layer is formed by depositing a thin layers of Ti, Cu, Ta, TiN, TaN, combinations thereof, or the like, using CVD or PVD techniques.

Figure 11:
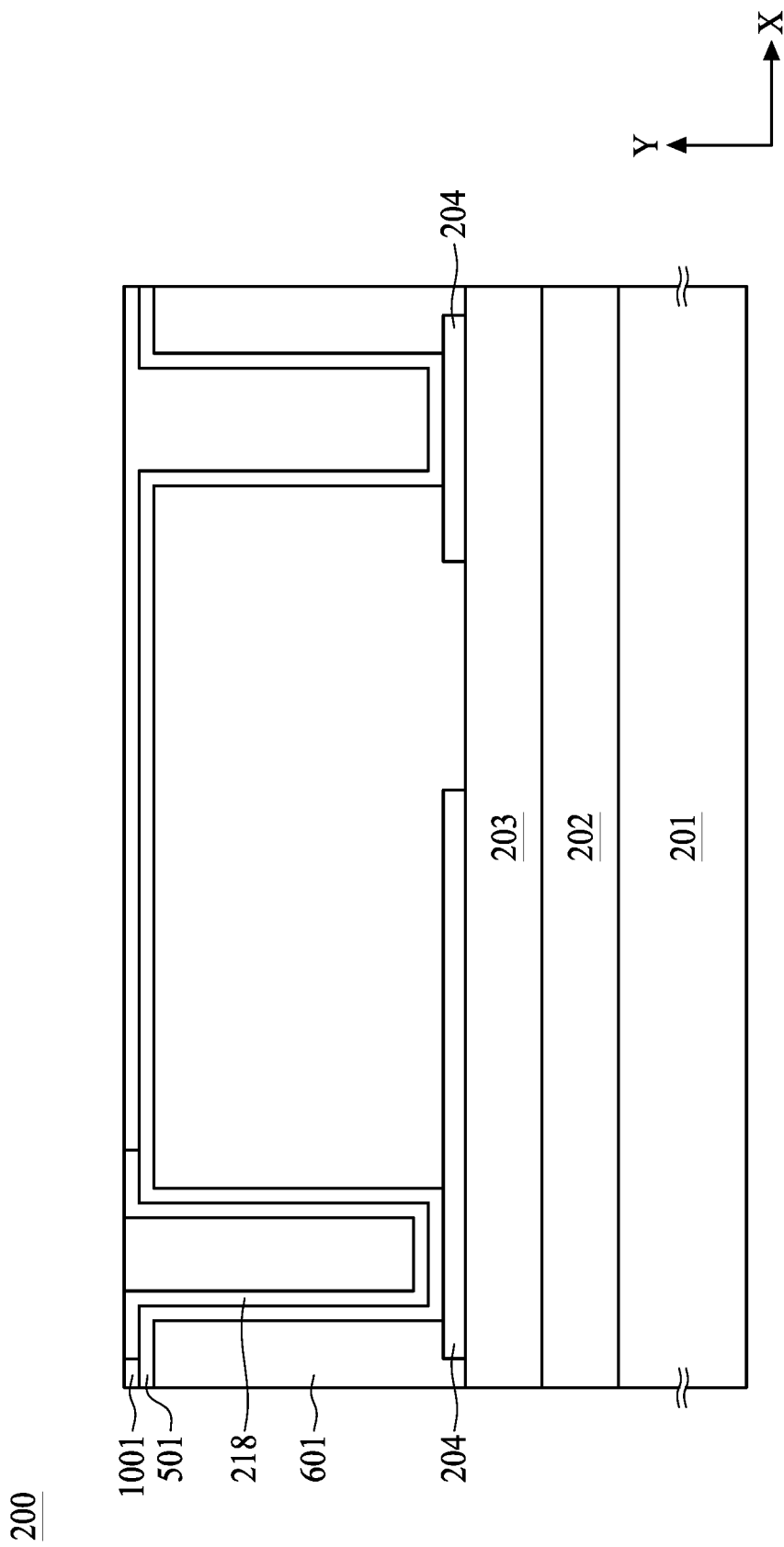
Figure 12:
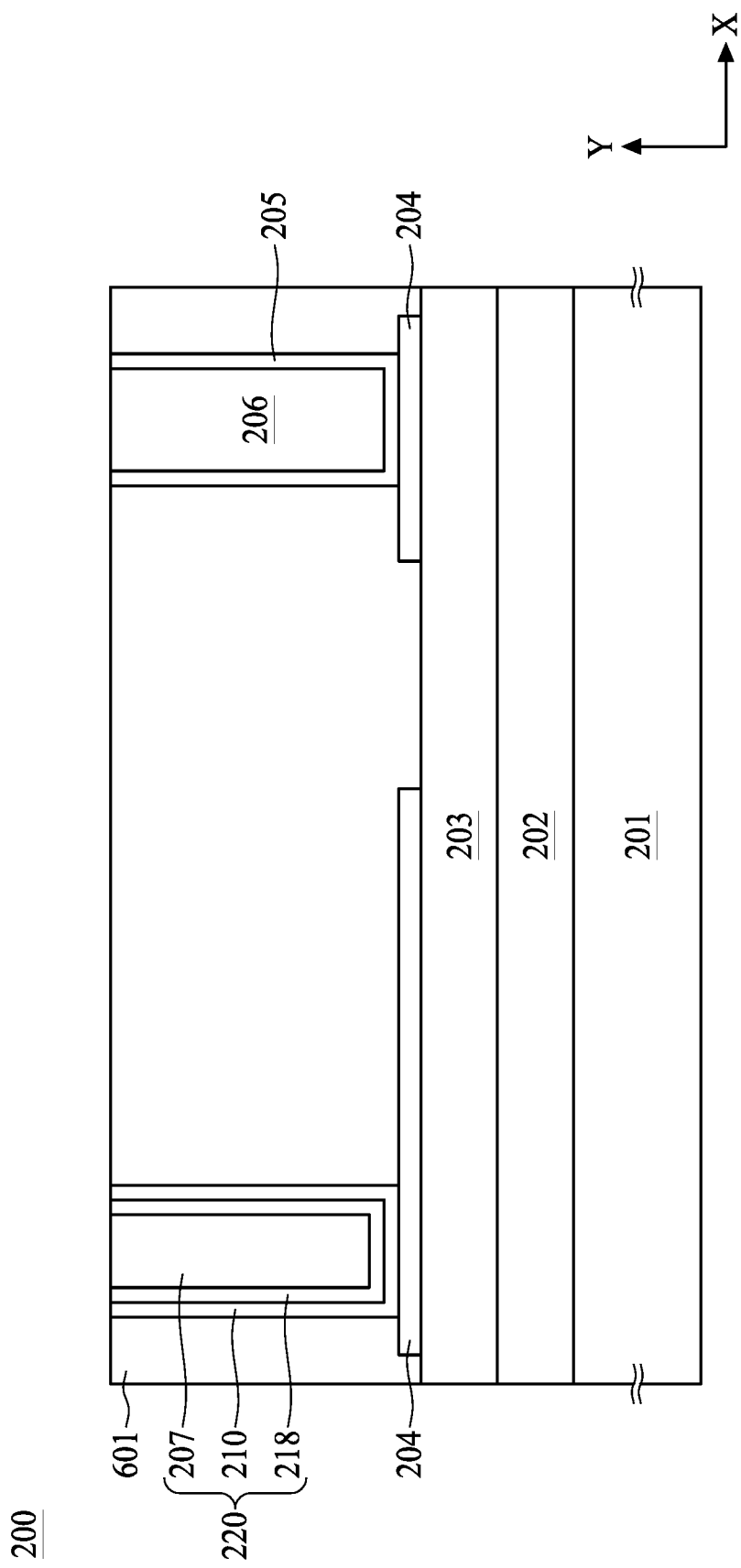

Next, excess portions of the conductive layer 1001 above the top surface of the insulation layer 218 may be removed. In some embodiments, a chemical mechanical polishing (CMP) process may be performed. The CMP stops at the top surface of the insulation layer 218 as illustrated in FIG. 11. After the removal of the conductive layer 1001 above the top surface of the insulation layer 218, excess portions of the conductive layer 1001, the insulation layer 218, and the conductive layer 501 above a top surface of the patterned photoresist 601 may be removed. In some embodiments, another CMP process may be performed. The CMP stops at the top surface of the patterned photoresist 601 as illustrated in FIG. 12. The conductive layer 1001 remained in the left and right openings 602 are denoted as the first electrode 207 and the TMV 206 respectively. The conductive layer 501 remained in the left and right openings 602 are denoted as the second electrode 210 and the conductive layer 205 respectively. At this stage, the structure of the MIM capacitor 220 including the first electrode 207, the insulation layer 218 and second electrode 210 is substantially formed over the InFO RDL 204.

Figure 13:
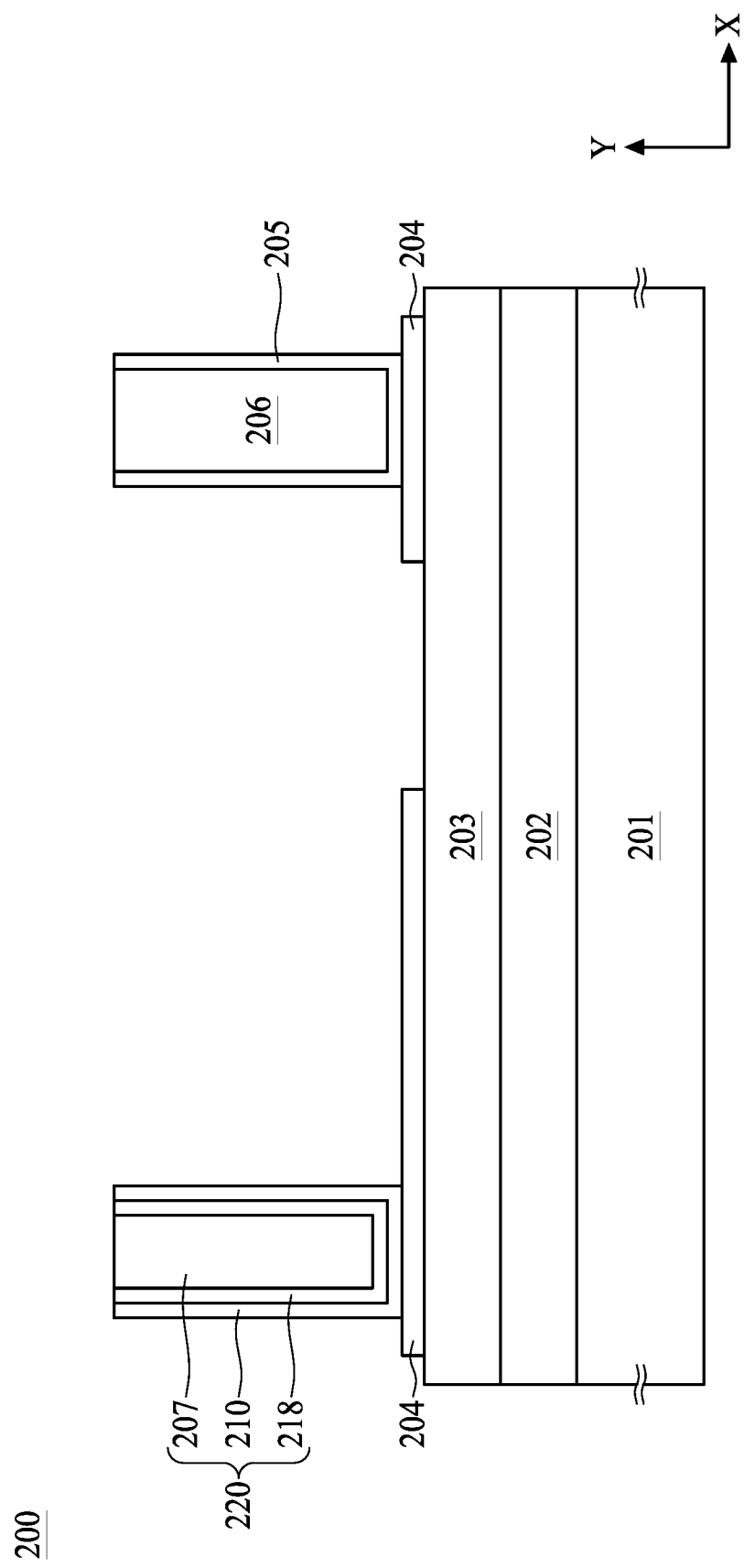
Figure 14:
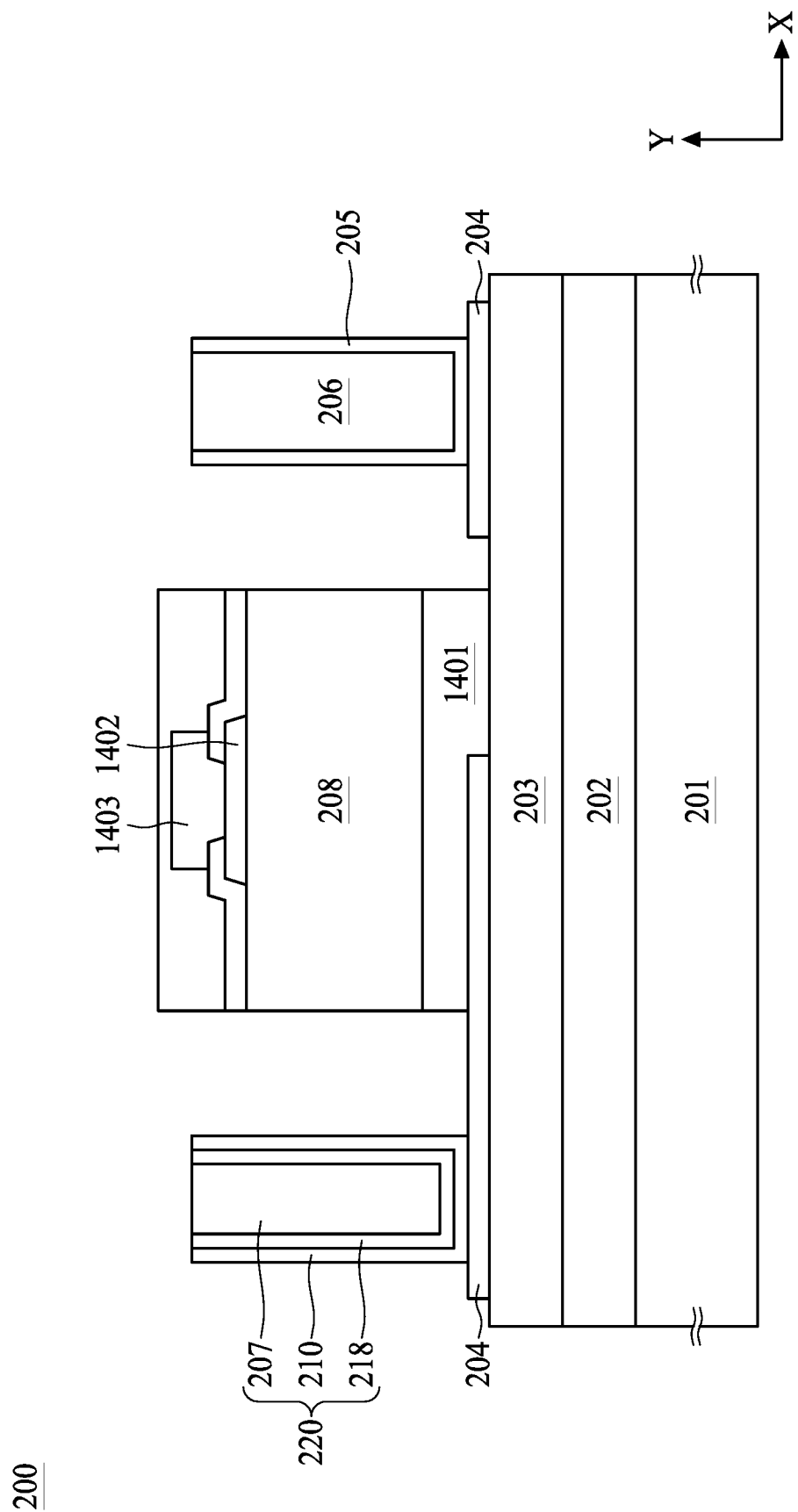

Next, the photoresist 601 is removed, as illustrated in FIG. 13. In some embodiments, a wet strip process is used to remove the photoresist 601. In some embodiments, the wet strip solution contains Dimethylsufoxide (DMSO) and Tetramethyl ammonium hydroxide (TMAH) to remove the photoresist material. After removing the photoresist 601, a device die 208 may be mounted and attached to the package 200 as illustrated in FIG. 14 through a DAF 1401. The DAF 1401 may include a polymer and in some embodiments includes a thermoplastic material. The DAF 1401 may be liquid, e.g., a thick liquid, when applied but forms a solid at room temperature. The DAF 1401 may become semi-liquid when heated and may become sticky to function as an adhesive at elevated temperatures. The DAF 1401 may include a polymer-based film that functions as an adhesive when heated, in some embodiments, for example. The device die 208 includes a conductive pad 1402 making electrical contact with the subsequent RDLs 212 and 214 through a conductive pillar 1403. In some embodiments, there may be more than one device die attached to the package 200.

Figure 15:
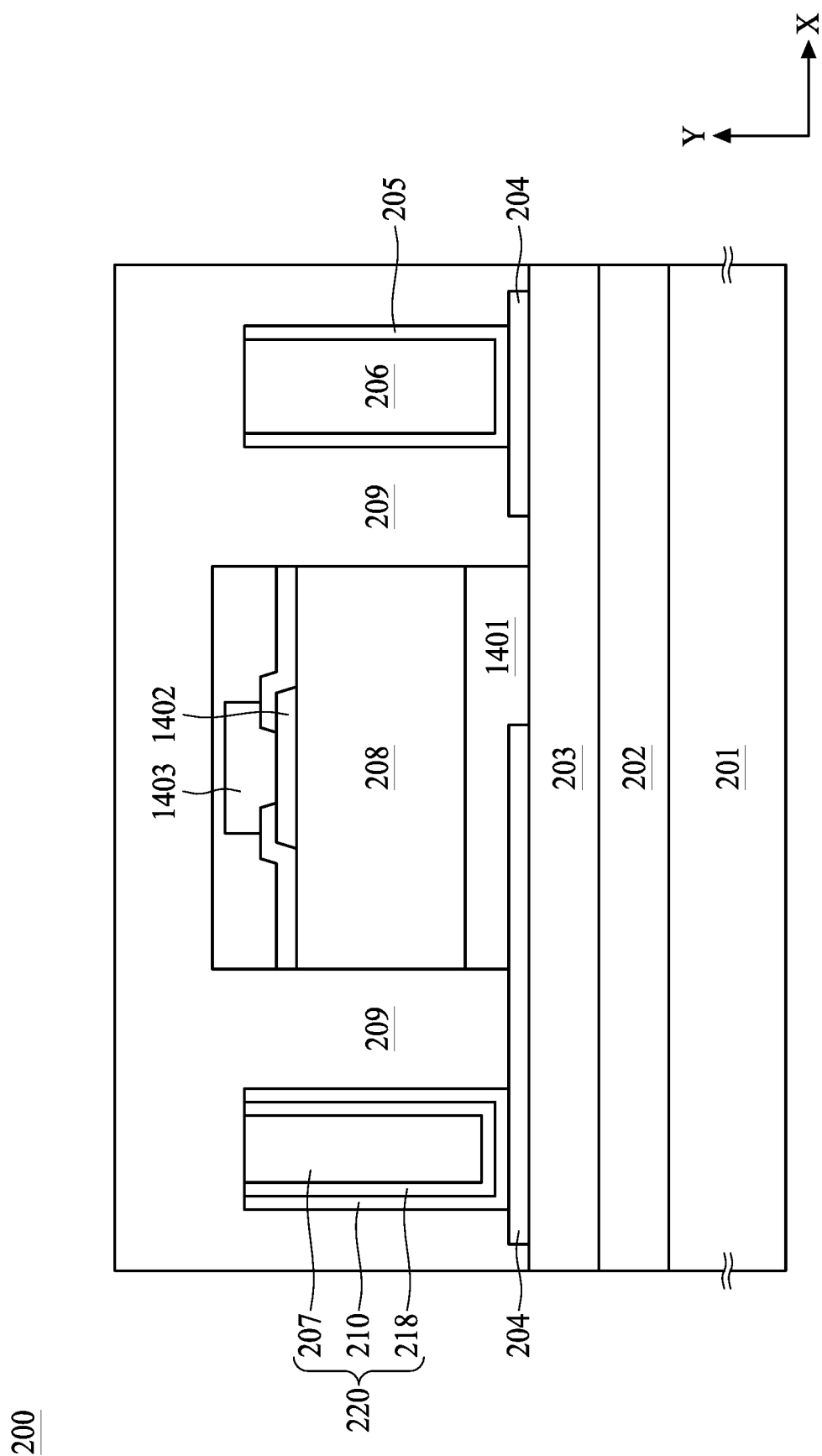

Next, the molding layer 209 is formed over the polymer base layer 203 to fill gaps between the device die 208 and the MIM capacitor 220 and the TMV 206 as illustrated in FIG. 15. In some embodiments, the molding layer 209 includes molding compound material with relatively high dielectric constant, including, for example, high-K polymer or silica. In some embodiments, compressive molding, transfer molding, and liquid encapsulant molding are suitable methods for forming the molding layer 209, but the present disclosure is not limited thereto. For example, the molding layer 209 may be dispensed in a liquid form. Subsequently, a curing process is performed to solidify the molding layer 209. In some embodiments, the filling of the molding layer 209 overflows the device die 208, the MIM capacitor 220, and the TMV 206, for example 50 um, so that the molding layer 209 covers top surfaces of the device die 208, the MIM capacitor 220, and the TMV 206 and encapsulates the device die 208, the MIM capacitor 220, the TMV 206, and the RDL 204.

Figure 16:
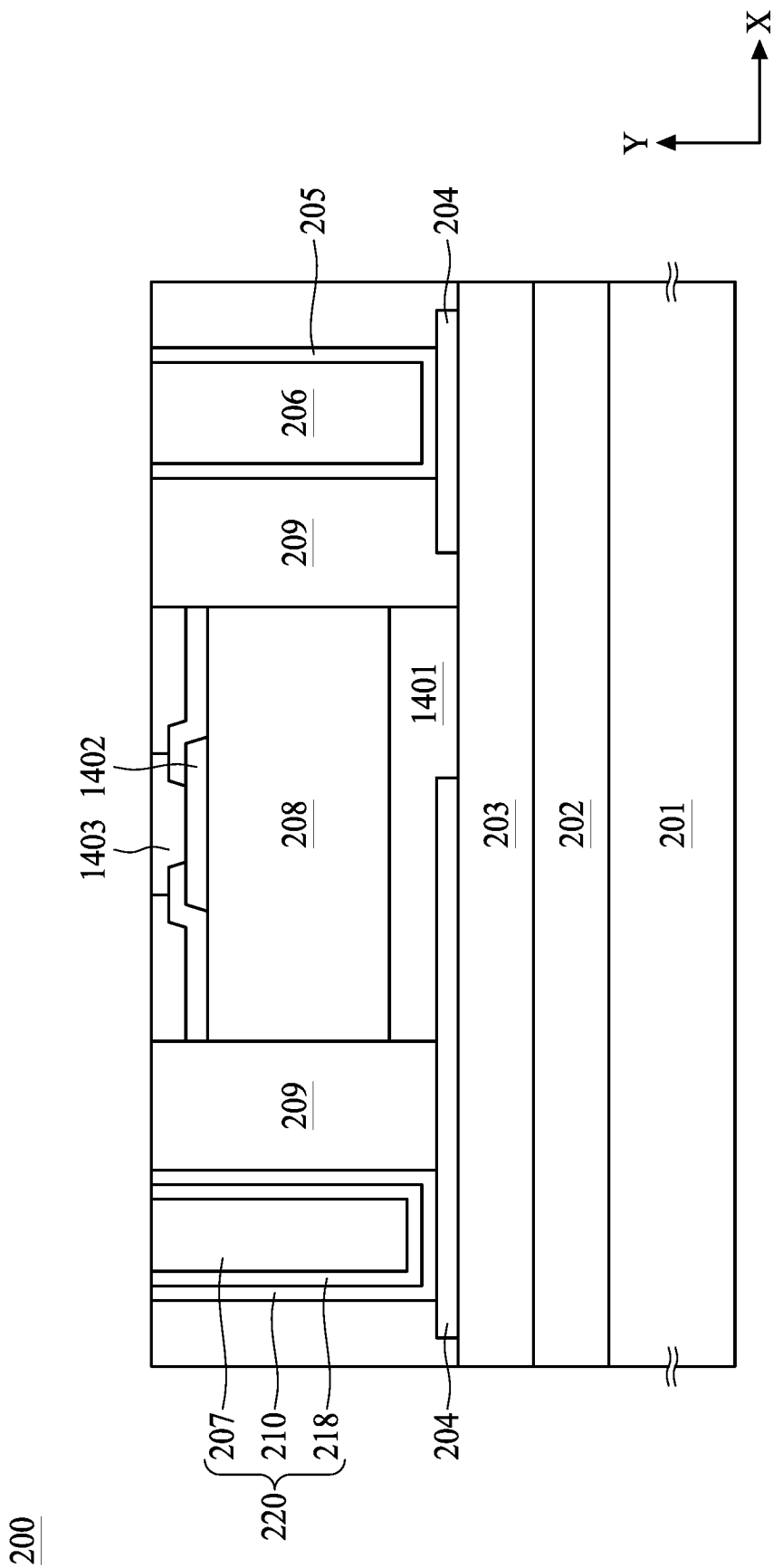

Next, a grinding process is performed, excess portions of the molding layer 209 are removed to reduce its overall thickness and thus expose the MIM capacitor 220 and the TMV 206. As shown in FIG. 16, the MIM capacitor 220 vertically, i.e. along Y-axis, passing through the molding layer 209. A top surface of the first electrode 207, the insulation layer 218 and the second electrode 210 of the MIM capacitor 220 are exposed. A top surface of the conductive pillar 1403, the TMV 206 and the conductive layer 205 are exposed as well.

Figure 17:
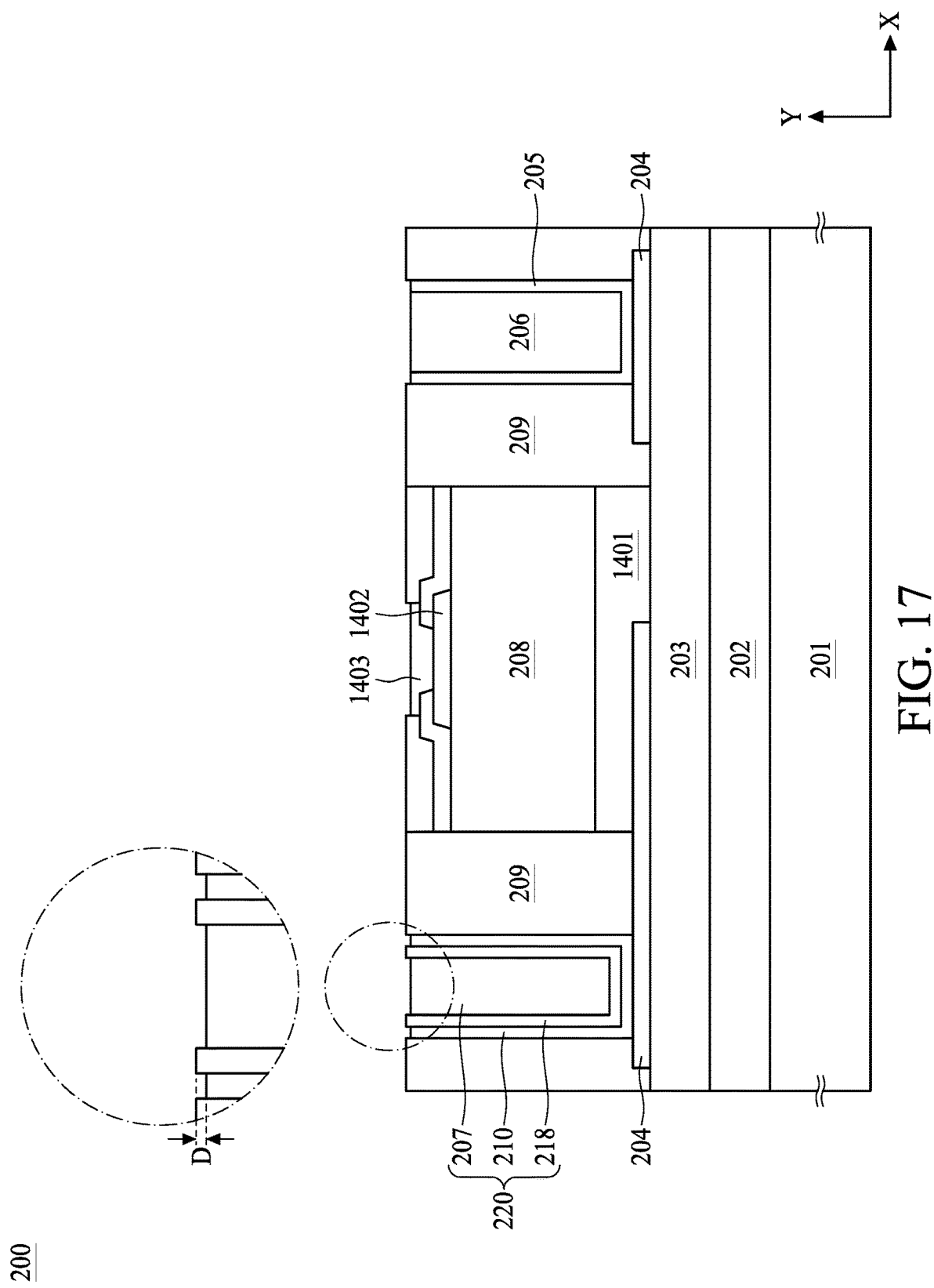

In some embodiments, at least a top portion of the first electrode 207 and a top portion of the second electrode 210 are removed. As shown in FIG. 17, the insulation layer 218 of the MIM capacitor 220 is therefore protruding upward from the top surface of the first electrode 207 and the top surface of the second electrode 210 by a depth D. In other words, the top surface of the first electrode 207 and the top surface of the second electrode 210 are recessed from the top surface of the insulation layer 218 and the top surface of the molding layer 209 by a depth D. In some embodiments, the depth D is about 0.1 um to about 1 um. The protruding structure of the insulation layer 218 is capable of efficiently isolating the first electrode 207 and the second electrode 210. In some embodiments, the removal process may be performed by dipping the package 200 in a wet etchant, such as an acid solution, for a duration that is specified by the recipe setting in order to etch conductive materials such as Cu. Please note that a top portion of the conductive pillar 1403, the conductive layer 205, and the TMV 206 may also be removed by the wet etchant, but the present disclosure is not limited thereto. In some embodiments, the top portion of the first electrode 207, the second electrode 210 may not be removed, i.e. the depth D equals 0.

Figure 18:
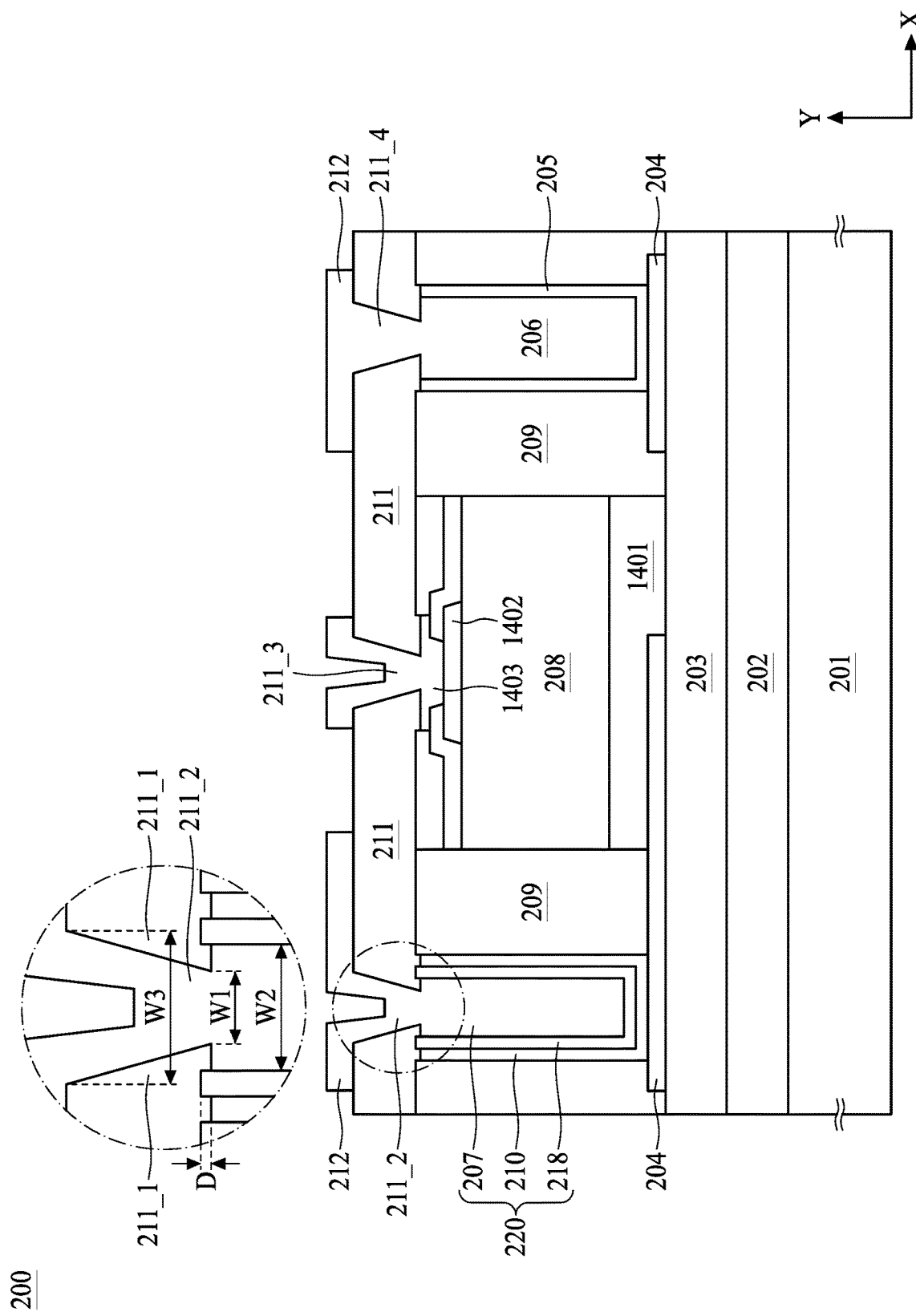

Next, the patterned polymer layer 211 having openings 211_2 to 211_4 is formed overlying the molding layer 209, the MIM capacitor 220, the conductive layer 205 and the TMV 206, as illustrated in FIG. 18. In some embodiments, the patterned polymer layer 211 includes a lateral overhang structure 211_1 pinching around the top surface of the MIM capacitor 220. The patterned polymer layer 211 covers the top surfaces of the molding layer 209, the second electrode 210, and the insulation layer 218. In particular, the lateral overhang structure 211_1 of the patterned polymer layer 211 further extends to cover a periphery region of the top surface of the first electrode 207, leaving an inner portion of the top surface of the first electrode 207 uncovered by the lateral overhang structure 211_1. As can be seen from a partially enlarged view around the overhang structure 211_1 in FIG. 18, the lateral overhang structure 211_1 forms the hole 211_2 having a bottom opening width W1 and a top opening width W3. The first electrode 207 has a width of W2 which is greater than W1. In some embodiments, W2 is less than W3, and an edge of the top opening of the hole 211_2 may overlap the insulation layer 218 from a top perspective view. However, the present disclosure is not limited thereto. In some embodiments, the edge of the top opening of the hole 211_2 may overlap the second electrode 210 or even the molding layer 209, which means the hole 211_2 has a wider top opening. In some embodiments, the hole 211_2 may have a narrower top opening and W3 may be less than W2 in that case. The overhang structure 211_1 is capable of efficiently isolating the first electrode 207 and the second electrode 210 and avoiding accidently coupling the first electrode 207 to the second electrode 210 at the subsequent RDL process.

In some embodiments, the polymer layer 211 includes PI, PBO, BCB, epoxy, silicone, acrylates, nano-filled pheno resin, siloxane, a fluorinated polymer, polynorbornene, or the like. In some embodiments, the polymer layer 211 is selectively exposed to a plasma etchant, including, for example, $CF_4$, $CHF_3$, $C_4F_8$, HF, etc., configured to etch the polymer layer 211 in order to expose the first electrode 207 and the TMV 206. In some embodiments, the openings are filled with a conductive material. For illustration, a seed layer (not shown) is formed in the openings and the conductive material is plated in the openings using, for example, an electrochemical plating process, electroless plating process, or the like. The resulting via holes in the polymer layer 211 are electrically coupled to the first electrode 207 and the TMV 206 respectively. In some embodiments, one or more additional polymer layers having conductive features, such as the RDL 212, are formed over the polymer layer 211. As illustratively shown in FIG. 18, in some embodiments, the RDL 212 is electrically coupled to the first electrode 207 and the TMV 206 through the via holes in the polymer layer 211.

Figure 19:
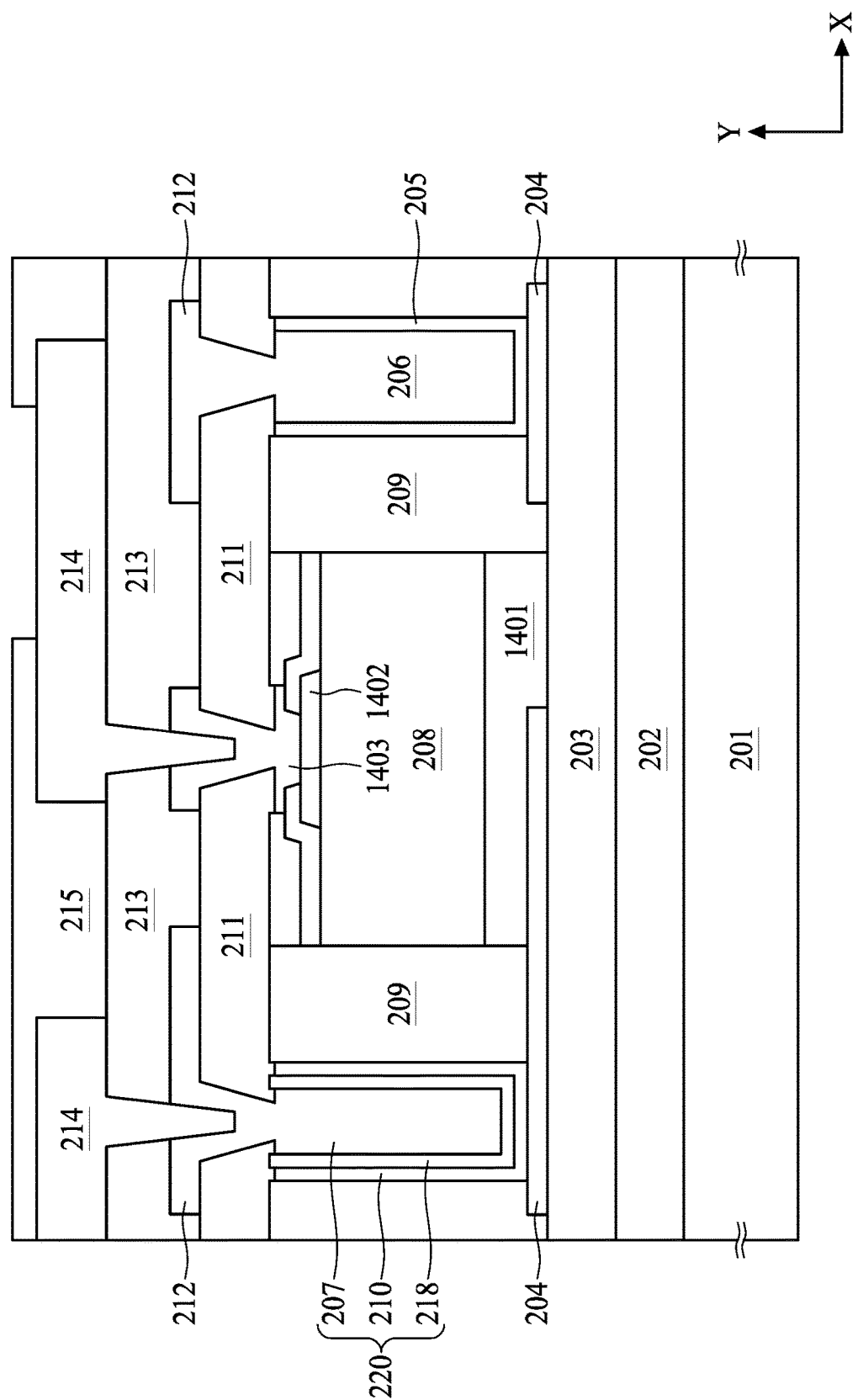

In FIG. 19, the patterned polymer layer 213 having openings is formed overlying the patterned polymer layer 211 and the RDL 212. In some embodiments, the polymer layer 213 includes PI, PBO, BCB, epoxy, silicone, acrylates, nano-filled pheno resin, siloxane, a fluorinated polymer, polynorbornene, or the like. In some embodiments, the polymer layer 213 is selectively exposed to a plasma etchant, including, for example, $CF_4$, $CHF_3$, $C_4F_8$, HF, etc., configured to etch the polymer layer 213 to form the openings.

In some embodiments, the RDL 214 having at least one conductive feature is formed on the patterned polymer layer 213. As illustratively shown, in some embodiments, the conductive features are electrically coupled to the conductive features in the RDL 212 through the via holes in the polymer layer 213. The conductive feature is electrically coupled to the device die 208 through the conductive vias and the conductive pillar 1403, and electrically coupled to the first electrode 207 of the MIM capacitor 220 through the conductive vias. In some embodiments, the RDLs 212 and 214 are substantially similar to the RDL 204 both in composition and formation process, and thus detailed description is omitted for brevity. In some embodiments, the patterned polymer layer 215 is formed overlying the patterned polymer layer 213 and the RDL 214, as illustrated in FIG. 19.

Figure 20:
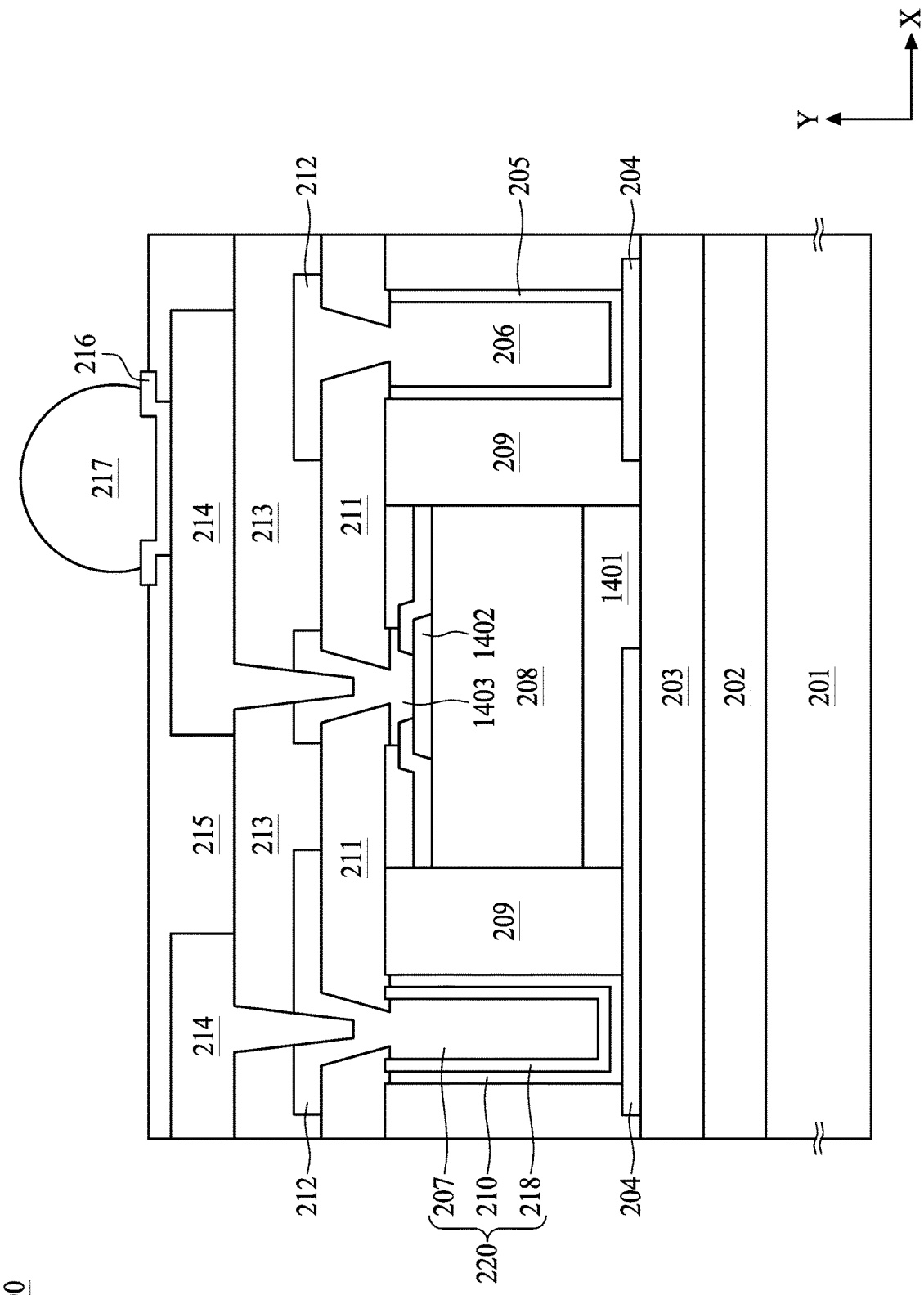

In FIG. 20, the external connector 217, which is configured to be the input/output (I/O) pads, including, for example, a solder ball on the UBM 216 is then formed to electrically connect to the device die 208 through the RDL 214. In some embodiments, the connector 217 are ball grid array (BGA) balls, controlled collapse chip connector (C4) bumps, and the like disposed upon the UBM 216, which are formed over the RDL 214. In some embodiments, the connector 217 is used to electrically connect the InFO package 200 to other package components including, for example, another device die, interposers, package substrates, printed circuit boards, a mother board, and the like.

Next, the carrier 201 and adhesive layer 202 are removed from the InFO package 200. The resulting structure is shown in FIG. 1. In some embodiments, the polymer base layer 203 is also removed from the InFO package. In some alternative embodiments, the polymer base layer 203 is not removed, and is left in the resulting package as a bottom protective layer.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Some embodiment of the present disclosure provides a semiconductor structure. The semiconductor structure includes: a polymer base layer; a backside redistribution layer (RDL) over the polymer base layer; a molding layer over the backside RDL; a polymer layer over the molding layer; a front side RDL over the polymer layer; and a metal-insulator-metal (MIM) capacitor vertically passing through the molding layer, the MIM capacitor including a first electrode, an insulation layer and a second electrode, wherein the insulation layer surrounds the first electrode, and the second electrode surrounds the insulation layer, and the molding layer surrounds the second electrode.

Some embodiment of the present disclosure provides a semiconductor structure. The semiconductor structure includes: a first redistribution layer (RDL); a molding layer over the first RDL; a polymer layer over the molding layer; a second RDL over the polymer layer; and a metal-insulator-metal (MIM) capacitor vertically passing through the molding layer, the MIM capacitor including a first electrode, an insulation layer and a second electrode, wherein an outer sidewall and an outer bottom surface of the first electrode is lined with the insulation layer, and an outer sidewall and an outer bottom surface of the insulation layer is lined with the second electrode.

Some embodiment of the present disclosure provides a method for manufacturing a semiconductor structure. The method includes: providing a polymer base layer; forming a first redistribution layer (RDL) over the polymer base layer; forming a photoresist layer having an opening passing through the photoresist layer over the first RDL; blanket disposing a first conductive layer over the photoresist layer and the RDL; blanket disposing an insulation layer over the conductive layer; etching a portion of the insulation layer to expose a portion of the first conductive layer outside the opening; disposing a second conductive layer over the insulation layer and the exposed first conductive layer; and planarizing the second conductive layer until the photoresist layer is exposed.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, comprising:
   providing a base layer;
   forming a photoresist layer over the base layer, the photoresist layer having an opening;
   blanket disposing a first conductive layer over the photoresist layer;
   blanket disposing an insulation layer over the conductive layer;
   etching a portion of the insulation layer to expose a portion of the first conductive layer outside the opening;
   disposing a second conductive layer over the insulation layer and the exposed first conductive layer;
   planarizing the second conductive layer until the photoresist layer is exposed; and
   removing the photoresist layer, wherein the first conductive layer, the insulation layer and the second conductive layer form a metal-insulator-metal (MIM) capacitor.

2. The method of claim 1, further comprising disposing a device die over the base layer.

3. The method of claim 1, further comprising forming a molding layer over the base layer.

4. The method of claim 3, further comprising performing a planarization process to remove excess portions of the molding layer to expose the MIM capacitor.

5. The method of claim 4, further comprising removing at least a top portion of the first conductive layer and a top portion of the second conductive layer.

6. The method of claim 5, further comprising forming a redistribution layer (RDL) over the MIM capacitor.

7. The method of claim 1, wherein the insulation layer includes high-k dielectric material.

8. The method of claim 7, wherein the insulation layer includes silicon nitride, silicon carbide, low-temperature silicon dioxide ($SiO_2$), silicon nitride ($SiN_x$), silicon oxynitride ($SiO_xN_y$), low-temperature titanium dioxide ($TiO_2$), zirconium dioxide ($ZrO_2$), aluminum oxide ($Al_2O_3$), hafnium oxide ($HfO_x$), Hafnium silicate ($HfSiO_x$), zirconium titanate ($ZrTiO_x$), tantalum oxide ($TaO_x$), strontium titanate ($SrTiO_3$), barium titanate (BaTiO3), barium strontium titanate ($BaSrTiO_3$), lead zirconate titanate ($PbZrTiO_3$), or a laminated layer of $ZrO_2$—$Al_2O_3$—$ZrO_2$.

9. A method for manufacturing a semiconductor structure, comprising:
   providing a polymer base layer;
   forming a redistribution layer (RDL) over the polymer base layer;
   forming a photoresist layer having an opening passing through the photoresist layer over the RDL;
   forming a metal-insulator-metal (MIM) capacitor vertically passing through the photoresist layer, the MIM capacitor including a first electrode, an insulation layer and a second electrode, wherein an outer sidewall and an outer bottom surface of the first electrode is lined with the insulation layer, and an outer sidewall and an outer bottom surface of the insulation layer is lined with the second electrode;
   performing a CMP upon the MIM capacitor and the photoresist layer; and
   removing the photoresist layer.

10. The method of claim 9, further comprising disposing a device die over the polymer base layer.

11. The method of claim 9, further comprising forming a molding layer over the base layer.

12. The method of claim 9, further comprising removing at least a top portion of the first conductive layer and a top portion of the second conductive layer.

13. The method of claim 11, further comprising forming a patterned polymer layer having openings overlying the molding layer and the MIM capacitor.

14. The method of claim 9, wherein the insulation layer includes high-k dielectric material.

15. The method of claim 9, wherein the insulation layer includes silicon nitride, silicon carbide, low-temperature silicon dioxide ($SiO_2$), silicon nitride ($SiN_x$), silicon oxynitride ($SiO_xN_y$), low-temperature titanium dioxide ($TiO_2$), zirconium dioxide ($ZrO_2$), aluminum oxide ($Al_2O_3$), hafnium oxide ($HfO_x$), Hafnium silicate ($HfSiO_x$), zirconium titanate ($ZrTiO_x$), tantalum oxide ($TaO_x$), strontium titanate ($SrTiO_3$), barium titanate (BaTiO3), barium strontium titanate ($BaSrTiO_3$), lead zirconate titanate ($PbZrTiO_3$), or a laminated layer of $ZrO_2$—$Al_2O_3$—$ZrO_2$.

16. A method for manufacturing a semiconductor structure, comprising:
providing a polymer base layer;
forming a first redistribution layer (RDL) over the polymer base layer;
forming a photoresist layer having an opening passing through the photoresist layer over the first RDL;
blanket disposing a first conductive layer over the photoresist layer and the first RDL;
blanket disposing an insulation layer over the conductive layer;
etching a portion of the insulation layer to expose a portion of the first conductive layer outside the opening;
disposing a second conductive layer over the insulation layer and the exposed first conductive layer; and
planarizing the second conductive layer until the photoresist layer is exposed.

17. The method of claim 16, further comprising:
removing a top portion of the first electrode and a top portion of the second electrode to allow the insulation layer to protrude upward from a top surface of the first electrode and a top surface of the second electrode.

18. The method of claim 16, further comprising disposing a device die over the polymer base layer.

19. The method of claim 16, further comprising forming a molding layer over the polymer base layer.

20. The method of claim 16, further comprising forming a second RDL over the second conductive layer.

* * * * *